VARIABLE RESISTANCE NETWORKS FOR CONTROLLING THE LOOP GAIN OF AN OSCILLATOR

Filed Feb. 3, 1967

INVENTOR
WALTER T. TOWNER
BY
Arnold & Roylance
ATTORNEYS

United States Patent Office 3,388,345

Patented June 11, 1968

3,388,345

VARIABLE RESISTANCE NETWORKS FOR CONTROLLING THE LOOP GAIN OF AN OSCILLATOR

Walter T. Towner, Canton, Mass., assignor to Weston Instruments, Inc., Newark, N.J., a corporation of Delaware Filed Feb. 3, 1967, Ser. No. 613,888
9 Claims. (Cl. 331—109)

ABSTRACT OF THE DISCLOSURE

An oscillator which includes an amplifier has a resistive feedback circuit and a variable AC impedance to ground provided by a diode circuit which controls the loop gain of the oscillator. The diode circuit is driven by a current from a power amplifier which is controlled by a DC voltage derived from the oscillator output signal, the magnitude of the DC voltage being proportional to the average value of the oscillator output signal and a DC reference voltage.

This invention relates to oscillator systems having an amplifier and a feedback network connected between the input and output terminals of the amplifier, and more specifically to such an oscillator system wherein the gain of the feedback network is variable and is controlled by a variable resistance circuit means responsive to the amplitude of the signals appearing at the amplifier output to control the amplitude of the system output signal.

In the oscillator art, it is well known to provide an amplifier with a positive feedback network which modifies the amplifier output signal in an appropriate way and connects that signal to the input terminal of the amplifier to sustain oscillations. Many such networks are known, including feedback networks having active as well as passive circuit elements.

A significant problem in the prior art has been the control of the amplitude of the oscillations produced by an oscillatory circuit of this category, especially where the amplitude control requirements were such that the oscillator is suitable for use in low-tolerance, closely controlled instrumentation and measuring devices.

An object of the present invention is to provide an oscillator system having variable impedance feedback circuit means for providing a controlled amplitude AC output signal.

Another object is to provide an oscillator system in which the feedback network includes a voltage variable impedance, the voltage control signal for which is a linear function of the amplitude of the AC oscillator output.

A further object is to provide a voltage variable impedance usable in an oscillator system wherein the impedance comprises a plurality of asymmetrically conductive circuit elements connected in a series circuit, the circuit being driven and controlled by a DC voltage from a power amplifier.

Yet another object is to provide an oscillator amplitude control apparatus which is simple and economical.

Oscillator systems according to the invention employ an active network which can be characterized as a linear modulator. An impedance is connected in the feedback network to attenuate the amplitude of the AC signal being fed back. The impedance is variable in magnitude and is controlled by a control voltage. The control voltage applied to the variable impedance is derived from the AC output signal itself, so that close control of the amplitude of the oscillator AC feedback signal, and therefore of the system output signal, is obtained.

More specifically, in order to control the net positive feedback gain of an oscillator, a small amount of AC current, derived from the oscillator output, is connected to a terminal which can be referred to as the resistance terminal of the linear modulator, and the resulting AC voltage drop across this controlled resistance is then applied to the input of the oscillator amplifier.

Reference is made to copending application Ser. No. 569,222 in the name of John G. Nordahl, filed Aug. 1, 1966, in which a system of this general type is disclosed wherein the linear modulator includes an operational amplifier. It has been found that a power amplifier of a type including circuitry similar to an operation amplifier can be employed in an apparatus of this type which, because of the superior operating characteristics of the combination, performs with good linearity over a predetermined range of control voltage. Also, this apparatus can be used with a correction circuit to eliminate system-generated noise signals and sudden changes in control voltage level to provide smooth error-free operation.

The linear modulator circuit itself includes power amplifier means for driving a variable resistance diode circuit, the control signal being applied to the power amplifier and the impedance circuit being connected to the oscillator amplifier.

In order that the manner in which the foregoing and other objects are obtained in accordance with the invention can be understood in detail, particularly advantageous embodiments thereof will be described with reference to the accompanying drawings which form a part of this specification and wherein.

Figure 1:
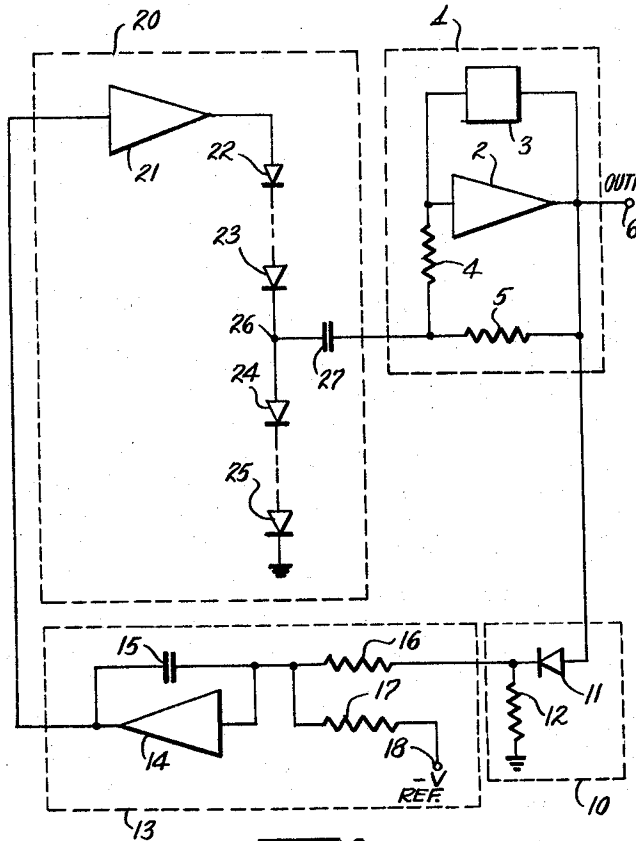
FIG. 1 is a schematic diagram of an oscillator system according to the invention.

Referring to FIG. 1, it will be seen that the apparatus includes a basic oscillator circuit 1 including an amplifier 2 and a feedback and frequency determining network 3 which can include active and/or passive circuit elements of a conventional type, network 3 being operative to feed a portion of the signal appearing at the output of amplifier 2 to the input with appropriate gain and shifts in phase to sustain oscillations. A second feedback network including a fixed resistor 4 and a fixed resistor 5 is connected between the input and output terminals of amplifier 2, resistors 4 and 5 being connected in series circuit relationship. The output of the oscillator appears at an output terminal 6 which can be connected to any utilization device.

The output of the oscillator is also connected to a rectifier circuit 10 which includes a conventional semiconductor diode 11, the anode of which is connected to the output of oscillator 1 and the cathode of which is connected to one terminal of a fixed resistor 12, the other terminal of which is connected to ground. The cathode of diode 11 is also connected to the input of filter circuit means 13 which includes a high gain operational amplifier 14 which has a capacitor 15 connected between the input and output terminals of amplifier 14 to form an operational integrator. The input terminal of amplifier 14 is connected to the output of rectifier 10 by a series fixed resistor 16, and to one terminal of a fixed resistor 17, the other terminal of which is connected to a source of DC reference voltage at a terminal 18. Resistors 16 and 17 are summing resistors which combine the output of rectifier 10 with the reference source at the input of the integrator. The output of filter circuit 13 is connected to the input of a modulator circuit 20 which includes a power amplifier 21, the input terminal of which is the input of the modulator circuit, and the output terminal of which is connected a plurality of conventional semiconductor diodes 22, 23, 24, and 25. Diode 22–25 are connected in series circuit relationship, all of the diodes being poled in the same direction, the series circuit being connected between the output terminal of amplifier 21 and a point of reference potential indicated in FIG. 1 as ground. The diode series circuit is shown as including four diodes, but can include two, four, or any other even number of diodes, the number being determined by the magnitude of the variable resistance required. The variable AC resistance to ground appears at the midpoint of the diode series circuit, at junction 26 which is connected to one terminal of a fixed coupling capacitor 27, the other terminal of which is connected to the junction between resistors 4 and 5 in the oscillator feedback circuit.

The operation of the apparatus of FIG. 1 is based upon deriving from the oscillator output a DC voltage proportional to the amplitude of the generated AC signal. The DC signal is derived by rectifier 10 and filter circuit means 13 and is provided at the input of amplifier 21 as a DC control signal. This control signal is provided as a driving current to the series diode circuit including diodes 22–25. As described in the previously mentioned Nordahl application, the forward resistance of a diode within a specific, relatively limited, range is inversely proportional to the current driven through the diodes. Thus the resistance between junction 26 and ground is proportional to the current provided to the series diodes circuit, and therefore to the DC voltage provided at the input terminal of amplifier 21. This linear relationship is true within a relatively narrow range, and exists so long as the DC control voltage applied to the input terminal of amplifier 21 is maintained at a relatively low level. The effective AC resistance to ground is coupled by capacitor 27 to the feedback circuit including resistors 4 and 5 and is effective to vary the AC feedback of oscillator circuit 1.

Figure 2:
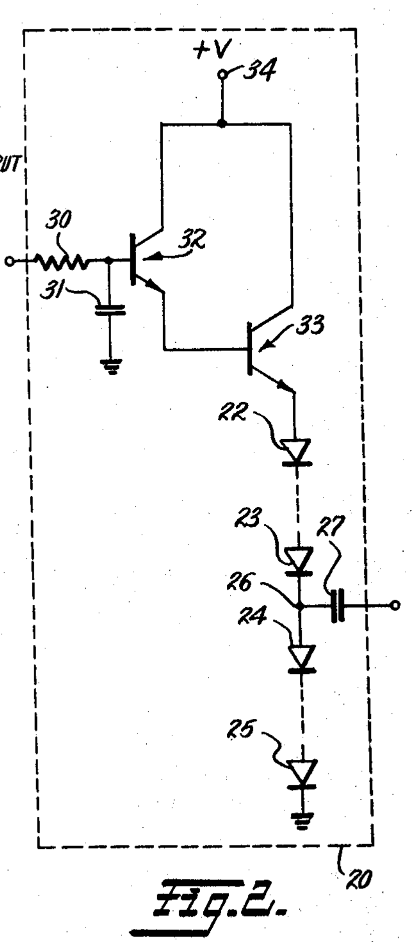
FIG. 2 is a schematic diagram of a linear modulator circuit usable in the apparatus of FIG. 1.

A modulator circuit which is especially useful in the apparatus in FIG. 1 is shown in FIG. 2 and includes a series input resistor 30 and a filter capacitor 31 between the input resistor and ground. Resistor 30 and capacitor 31 act to further filter the DC control voltage applied to the amplifier. The amplifier includes two conventional NPN transistors 32 and 33, the collector electrodes of both transistors being connected to a source terminal 34 to which a positive DC voltage is connected. The base electrode of transistor 32 is connected to the input resistor and capacitor. The emitter electrode of transistor 32 is connected to the base electrode of transistor 33. The emitter electrode of transistor 33 is connected to the anode of diode 22 and provides the driving current to the series diode circuit. As will be recognized by those skilled in the art, a positive increase of the control voltage applied through resistor 30 to the base electrode of transistor 32 causes transistor 32 to become more conductive, decreasing the effective impedance across the emitter collector circuit of transistor 32 and elevating the potential at the base electrode of transistor 33. Transistor 33 therefore increases in conductivity, providing an increased current to the series diode circuit.

The modulator of FIG. 2 provides a significant advantage over a modulator of a similar type which incorporates an operational amplifier with a diode feedback circuit. Although the operational amplifier and diode feedback circuit provides significant linearity over a relatively wide range of input control voltages, it has been found that at a slight sacrifice of linearity of resistance vs. input control voltage, the circuit of FIG. 2 provides effective control and is substantially less expensive and less complex. This is true because only two transistors are required and no diodes are used other than those in the series diode circuit between the amplifier and ground, whereas an operational amplifier, in simplest form, includes four or five transistors and requires a number of diodes in a feedback circuit between the input and output terminals of the amplifier, this number being equal to the number in the series diode circuit shown in FIG. 2. The modulator, or variable resistance element, is contained within a high negative feedback control loop so that any nonlinearity of the transfer function between the controlled resistance output of the modulator and the controlling input voltage is substantially reduced.

Figure 3:
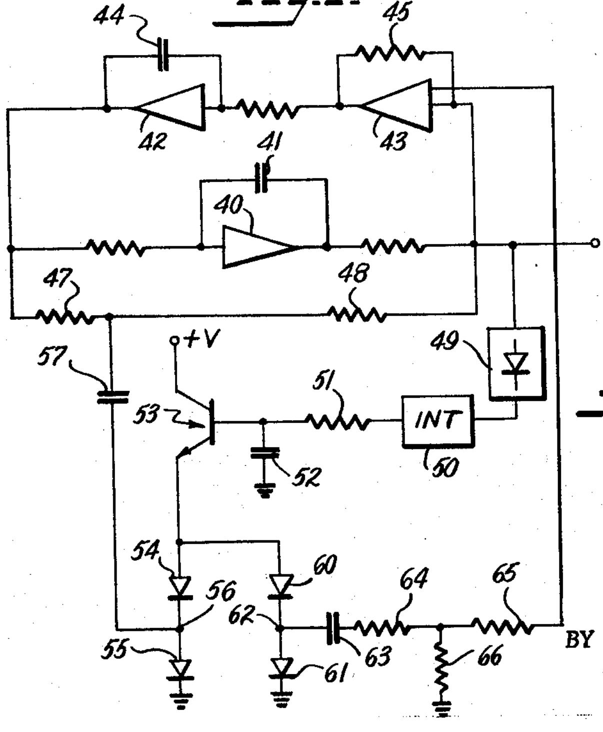
FIG. 3 is a schematic diagram of a second embodiment of an oscillator apparatus according to the invention.

In FIG. 3 a form of the modulator is shown incorporated in a continuously variable oscillator of the dual integrator inverter type. The basic oscillator itself includes an operational amplifier 40 with a capacitor 41 connected between the input and output terminals of the amplifier to form an operational integrator. An amplifier 42 and an amplifier 43 are connected in series circuit relationship with amplifier 40, amplifier 42 being provided with a parallel capacitor 44 to form an operational integrator and amplifier 43 being provided with a feedback resistor 45 to form an inverting amplifier. The theory of operation of this oscillator is that each integrator provides approximately 90° of phase shift and the inverter provides 180° of phase shift, the loop shift then being 360° with sufficient gain to sustain oscillations. In practice, the loop gain and phase shift are not generally sufficient to provide continuous oscillations so that it is necessary to provide an additional loop including fixed resistors 47 and 48 connected in series circuit relationship in parallel with amplifier 40 and the coupling resistors. The output of the oscillator is connected through a rectifier 49, an integrator circuit 50, and a filter circuit including resistor 51 and capacitor 52 to the base electrode of a conventional NPN transistor indicated generally at 53, the collector electrode of which is connected to a positive DC source and the emitter electrode of which is connected to a series diode circuit including conventional semiconductor diodes 54 and 55. The junction 56 between diodes 54 and 55 is coupled to the junction between resistors 47 and 48 by a coupling capacitor 57.

The emitter electrode of transistor 53 is also connected to a series diode circuit including diodes 60 and 61, the junction 62 between the diodes being connected to a coupling circuit including a series capacitor 63, fixed series resistors 64 and 65, and a resistor 66 connected between the series circuit and ground.

The apparatus of FIG. 3 is effective to suppress low frequency transients which are likely to arise in the basic oscillator loop as follows. Any such transient which appears at the output of the oscillator, and is coupled to the base electrode of transistor 53, also necessarily appears at the emitter electrode of transistor 53. The effective load at junction 56 is substantially equal to that at junctions 62, both of these being of significantly greater impedance than the diode series circuits themselves, so that the transients appear at these two junctions in substantially equal fashion. The two voltage appearing at these junctions are differentially summed to the input of amplifier 43 through resistor 48 and the resistor network including resistors 64 and 65, resulting in a substantial cancellation of the transient voltages, and a net loop gain of zero for these transient voltages.

In addition, any tendency for the oscillator loop to enter into a oscillatory condition at a frequency other than the desired oscillation frequency, thereby modulating the oscillator frequency, is suppressed by this transient suppression network. The circuit therefore acts as an amplitude control, as discussed above, and also as a transient suppression and stabilizing circuit.

While advantageous embodiments have been chosen to illustrate the invention, it will be understood by those skilled in the art that various changes and modifications can be made therein without departing from the scope of the invention as defined in the appended claims.

What is claimed is:

1. An amplitude control apparatus especially useful with an oscillator of the type including an amplifier having positive feedback circuit means for shifting the phase of the amplifier output signal and connecting it to the amplifier input to sustain oscillations, the apparatus comprising first and second resistors connected between the input and output of the oscillator amplifier, said first and second resistors being connected in series circuit relationship; a capacitor having one terminal connected to the junction between said first and second resistors; a rectifier circuit having an input termnal and an output terminal, said input terminal of said rectifier circuit being connected to the output of the oscillator amplifier; filter circuit means having an input terminal and an output terminal, said input terminal of said filter circuit means being connected to said output terminal of said rectifier circuit; and variable resistance circuit means having an input terminal and an output terminal, said input terminal of said variable resistance circuit means being connected to said output terminal of said filter circuit means, said output terminal of said variable resistance circuit means being connected to the other terminal of said capacitor, said variable resistance circuit means being responsive to a DC signal produced by said rectifier and said filter circuit means to provide a variable AC resistance to ground proportional to the amplitude of the output of the oscillator amplifier.

2. An apparatus according to claim 1 wherein said filter circuit means comprises an integrator circuit comprising a high gain amplifier, and a capacitor connected between the input and output terminals of said high gain amplifier.

3. An apparatus according to claim 2 and further comprising a source of reference DC voltage, and a resistor interconnecting said source of reference voltage and the input of said high gain amplifier.

4. An apparatus according to claim 1 wherein said variable resistance circuit means comprises a power amplifier and a plurality of conventional semiconductor diodes connected between the output of said power amplifier and a point of reference potential, said diodes all being poled in the same direction, the output of said variable resistance circuit means being connected to an intermediate point in said plurality of diodes.

5. An apparatus according to claim 1 wherein said variable resistance circuit means comprises a transistor having a base electrode, an emitter electrode, and a collector electrode, and an even number of conventional semiconductor diodes connected in series circuit relationship between the emitter electrode of said transistor and a point of reference potential, said diodes all being poled in the same direction; an input resistor connected between said base electrode and said input terminal of said variable resistance circuit means; and a capacitor connected between said base electrode and said point of reference potential.

6. An apparatus according to claim 1 wherein said variable resistance circuit means comprises first and second semiconductor electron valves, each having a base electrode, an emitter electrode, and a collector electrode, said emitter electrode of said first transistor being connected to said base electrode of said second transistor; an even number of semiconductor diodes connected between said emitter electrode of said second transistor and ground; an input resistor connected between said base electrode of said first transistor and the output of said filter circuit means; and a capacitor connected between said base electrode of said first transistor and ground; the midpoint of said diode series circuit constituting the output terminal of said variable resistance circuit means.

7. In an oscillator apparatus of the type including an amplifier and positive feedback circuit means for shifting the phase of the amplifier output signal and regeneratively connecting it to the amplifier input to sustain oscillations, an amplitude control apparatus comprising first and second resistors connected between the input and output of the oscillator amplifier, said first and second resistors being connected in series circuit relationship; a capacitor having one terminal connected to the junction between said first and second resistors; a rectifier circuit having an input terminal and an output terminal, said input terminal of said rectifier circuit being connected to the output of the oscillator amplifier; filter circuit means having an input terminal and an output terminal, said input terminal of said filter circuit means being connected to said output terminal of said rectifier circuit; variable resistance circuit means having an input terminal and two output terminals, said input terminal of said variable resistance circuit means being connected to said output terminal of said filter circuit means, one of said output terminals of said variable resistance circuit means being connected to the other terminal of said capacitor, said variable resistance circuit means being responsive to a DC signal produced by said rectifier and said filter circuit means to provide at said one output terminal a variable AC resistance to ground proportional to the amplitude of the output of the oscillator amplifier.

8. An apparatus according to claim 7 wherein said variable resistance circuit means comprises a power amplifier and first and second diode circuits connected in parallel circuit relationship between the output of said power amplifier and ground, the diodes in said diode circuits all being poled in the same direction relative to ground, said two output terminals being connected to intermediate points in said diode circuits.

9. An apparatus according to claim 7 wherein said variable resistance circuit means comprises a transistor having an emitter electrode and two other electrodes; and first and second diode circuits, each said diode circuit being connected between said emitter electrode and a point of reference potential, an intermediate point in said first diode circuit being connected to one of said two output terminals and an intermediate point in said second diode circuit being connected to the other of said two output terminals.

No references cited.

JOHN KOMINSKI, *Primary Examiner.*

Disclaimer and Dedication 3,388,345.—*Walter T. Towner*, Canton, Mass. VARIABLE RESISTANCE NETWORKS FOR CONTROLLING THE LOOP GAIN OF AN OSCILLATOR. Patent dated June 11, 1968. Disclaimer and dedication filed Mar. 17, 1971, by the assignee, *Weston Instruments, Inc.*

Hereby enters this disclaimer to the remaining term of said patent and dedicates said patent to the Public.

[*Official Gazette April 27, 1971.*]